United States Patent
McLaurin

(10) Patent No.: US 8,824,980 B2
(45) Date of Patent: Sep. 2, 2014

(54) SYSTEM AND METHOD TO IMPLEMENT A RADIO TRANSMITTER WITH DIGITAL PREDISTORTION HAVING REDUCED NOISE

(75) Inventor: David J. McLaurin, Durham, NC (US)

(73) Assignee: Analog Devices, Inc., Norwood, MA (US)

( * ) Notice: Subject to any disclaimer, the term of this patent is extended or adjusted under 35 U.S.C. 154(b) by 34 days.

(21) Appl. No.: 13/603,651

(22) Filed: Sep. 5, 2012

(65) Prior Publication Data

US 2014/0065989 A1    Mar. 6, 2014

(51) Int. Cl.
*H04B 1/04* (2006.01)
*H04B 17/00* (2006.01)

(52) U.S. Cl.
USPC ............ 455/114.3; 455/63.1; 455/67.13; 455/126; 375/296; 375/297

(58) Field of Classification Search
CPC .............. H03F 1/3247; H03F 1/3241; H03F 2001/3233; H03F 2200/451; H04B 1/0475; H04B 2001/0425; H04B 2001/0433; H04B 2001/0408; H04L 27/368; H04G 3/3042; H04G 3/3047
USPC ........... 455/63.1, 67.13, 114.2, 114.3, 115.1, 455/126; 375/296, 297
See application file for complete search history.

(56) References Cited

U.S. PATENT DOCUMENTS

| | | | | |
|---|---|---|---|---|
| 6,567,478 | B2 * | 5/2003 | Oishi et al. | 375/297 |
| 6,570,444 | B2 * | 5/2003 | Wright | 375/297 |
| 6,937,669 | B2 * | 8/2005 | Tomerlin et al. | 455/114.3 |
| 7,099,399 | B2 * | 8/2006 | McCallister | 375/296 |
| 7,203,247 | B2 * | 4/2007 | Bauder et al. | 455/114.3 |
| 7,333,559 | B2 * | 2/2008 | Song et al. | 375/296 |
| 7,418,056 | B2 * | 8/2008 | Suzuki et al. | 375/296 |
| 7,590,190 | B2 * | 9/2009 | Luke et al. | 455/126 |
| 7,706,467 | B2 * | 4/2010 | Kenington | 375/296 |
| 8,536,943 | B2 * | 9/2013 | Irvine | 330/149 |

* cited by examiner

Primary Examiner — Quochien B Vuong
(74) Attorney, Agent, or Firm — Kenyon & Kenyon, LLP

(57) ABSTRACT

A system and method provide for a radio transmitter with digital predistortion. The radio transmitter includes a high output power narrowband upconverter and a low output power wideband upconverter. In a stage of the radio transmitter, digital predistortion is applied to transmit data by setting digital coefficients by a digital predistortion algorithm, resulting in a predistortion signal. A predistortion signal is separated into a narrowband component and a wideband component, where the narrowband component corresponds to a desired traffic signal and the wideband component corresponds to a digital predistortion signal reflecting separated digital predistortion correction products. The narrowband upconverter provides a transmission path for a desired traffic signal or transmit data (the narrowband component of the digital predistortion signal), while the wideband upconverter provides a transmission path for the wideband component representing digital predistortion correction products.

27 Claims, 2 Drawing Sheets

SYSTEM AND METHOD TO IMPLEMENT A RADIO TRANSMITTER WITH DIGITAL PREDISTORTION HAVING REDUCED NOISE

FIELD OF THE INVENTION

The present invention relates to a radio transmitter with digital predistortion. The present invention relates to a digital predistortion transmitter having reduced noise within a synthesis bandwidth. The present invention further relates to a method for reducing noise within the synthesis bandwidth of a digital predistorted transmitter. The present invention further relates to a radio transmitter having upconverters to reduce distortion at the output.

BACKGROUND INFORMATION

Radio transmitters in most telecommunications systems are required to accurately reproduce a signal present at the input of the radio transmitter at an output amplifier of the transmitter. An output amplifier that compresses its input or has a non-linear input-to-output relationship causes the output signal to distort and leak onto adjacent radio channels, resulting in undesired interference. Digital predistortion ("DPD") circuits inversely model an amplifier's characteristics and when combined with the amplifier, produce an overall system that is more linear and reduces the amplifier's distortion by attempting to cancel any non-linearity the amplifier might have.

Predistortion is used in particular in high power radio transmitters, as the amplifiers in these transmitter tend to become more non-linear as their output power increases towards a maximum allowable output. State of the art high power transmitters implement amplifier linearization techniques, such as digital predistortion, to increase power and efficiency while meeting the adjacent channel leakage limits specified by wireless standards.

In traditional systems using predistortion techniques, transmitter baseband bandwidth commonly may be at least five times greater than that of the desired transmit signal. In these systems, noise associated with a transmit synthesis band can fall into or overlap a paired receive band, which limits the sensitivity of the receiver. This may also result in undesired emissions due to distortion. Efforts to address the undesired noise in the receive band have focused on cavity filters that are grouped in duplexers to reject the receive band noise. These cavity duplexers allow for the passing through of desired frequencies and rejection of the undesired frequencies, in this case, rejecting the receive band noise at certain noise levels. Unfortunately, cavity duplexers are difficult to implement because of the high cost of cavity filters, rendering these systems expensive from a cost standpoint.

Thus there remains a need in the art for an efficient, cost-effective radio transmitter with digital predistortion having reduced noise from the receive band in the transmit synthesis bandwidth. There further remains a need in the art for a process for reducing noise in a transmit synthesis bandwidth in a radio transmitter.

SUMMARY OF THE INVENTION

A system and method are described herein that provide for a radio transmitter with digital predistortion. The radio transmitter includes a high output power narrowband upconverter and a low output power wideband upconverter. In a stage of the radio transmitter, digital predistortion is applied to transmit data by setting digital coefficients by a digital predistortion algorithm, resulting in a predistortion signal. A predistortion signal is separated into a narrowband component and a wideband component, where the narrowband component corresponds to a desired traffic signal and the wideband component corresponds to a digital predistortion signal reflecting separated digital predistortion correction products. The narrowband upconverter provides a transmission path for a desired traffic signal or transmit data (the narrowband component of the digital predistortion signal), while the wideband upconverter provides a transmission path for the wideband component representing digital predistortion correction products.

In particular, the exemplary embodiments of the present invention are directed to a radio transmitter having reduced noise. The radio transmitter includes a power amplifier and a digital predistortion arrangement to apply digital predistortion to a transmit signal which generates a predistortion signal. The radio transmitter also includes a first upconverter to upconvert a narrowband component of the predistortion signal and a second upconverter to upconvert a wideband component of the predistortion signal. In an embodiment, the narrowband component of the predistortion signal is the transmit signal. In an embodiment, the wideband component of the predistortion signal represents digital predistortion correction products. A summation block may add the upconverted narrowband component of the predistortion signal with the upconverted wideband component of the predistortion signal and output to the power amplifier.

The digital predistortion of the radio transmitter may be set by coefficients determined by a digital predistortion algorithm. The coefficients may be determined by the digital predistortion algorithm to minimize a difference between the desired transmit signal and an output of the power amplifier. The radio transmitter may also include an equalization arrangement to correct at least one of a phase difference, group delay, and amplitude response between the narrowband component and the wideband component.

Both the first and second upconverters include a digital-to-analog converter and a modulator. The first upconverter includes a modulator to modulate the narrowband component with a varying signal, whereas the second upconverter includes a modulator to modulate the wideband component with the same varying signal. The varying signal can be for example, a sinusoid wave carrier or a square wave carrier. Both the first and second upconverter may also include a filter To filter out DAC images. In an embodiment, the filter in the first upconverter may have a narrower bandwidth than the filter in the second upconverter.

The radio transmitter may also include an amplifier to correct a gain difference between the first and the second upconverter, as well as a downconverter to monitor an output of the power amplifier. The equalization arrangement may be set by the downconverter.

The exemplary methods of the present invention are also directed to a method for reducing noise due to distortion in a radio transmitter. The method includes the steps of generating a predistortion signal from an application of digital predistortion coefficients to a transmit signal and separating the predistortion signal into narrowband and wideband components. Correction may occur for at least one of a phase difference, group delay, and amplitude response between the narrowband component and the wideband components.

The method further includes upconverting the narrowband component of the predistortion signal to a higher frequency through modulation with a varying signal by a first upconverter and upconverting the wideband component of the predistortion signal to the higher frequency through modulation with the varying signal by a second upconverter. After upconversion, the upconverted narrowband component and the upconverted wideband component are summed and output to the power amplifier.

DETAILED DESCRIPTION

The subject invention will now be described in detail for specific preferred embodiments of the invention, it being understood that these embodiments are intended only as illustrative examples and the invention is not to be limited thereto.

The present invention provides a radio transmitter with digital predistortion. In an embodiment, the radio transmitter includes a high output power narrowband upconverter and a low output power wideband upconverter. In a stage of the radio transmitter, digital predistortion is applied to transmit data by setting digital coefficients, resulting in a predistortion signal. A predistortion signal may be separated into a narrowband component and a wideband component, where the narrowband component may correspond to the desired traffic signal and the wideband component may correspond to a digital predistortion signal reflecting separated digital predistortion correction products. The narrowband upconverter may be used as a transmission path for a desired traffic signal or transmit data (the narrowband component of the digital predistortion signal), while the wideband upconverter may be used as a transmission path for wideband component representing digital predistortion correction products. Because the traffic signal may comprise only ⅕th of the bandwidth of the predistortion signal, it may be filtered separately, at ⅕th of the corner frequency. The invention provides the advantage that by reducing the bandwidth of the transmit signal path, high frequency digital-to-analog images are further reduced, relaxing radio frequency filtering requirements.

Figure 1:
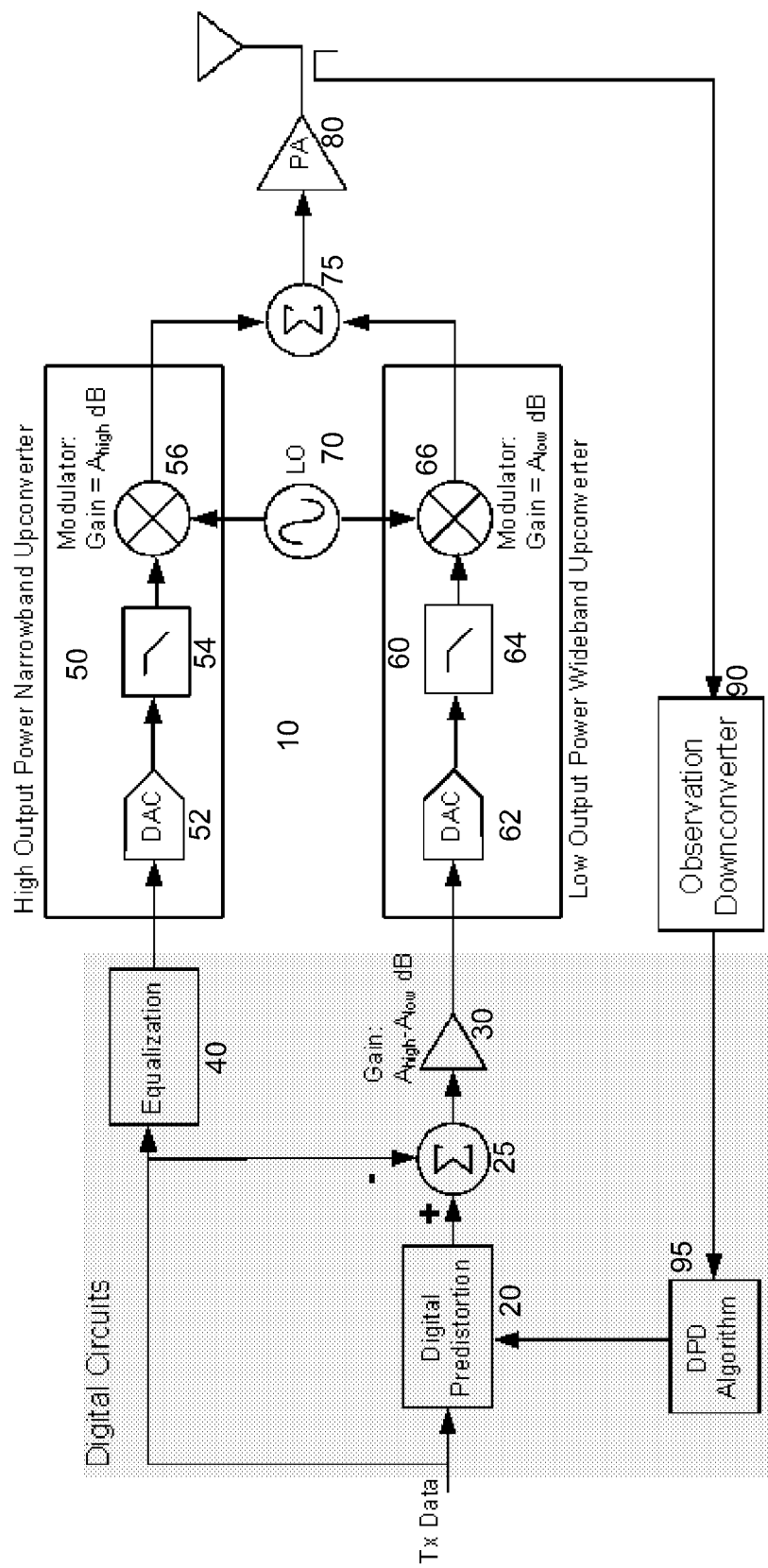
FIG. 1 is a diagram of a radio transmitter with digital predistortion having reduced noise within the synthesis bandwidth according to an embodiment of the present invention.

FIG. 1 illustrates an embodiment of a stage of a radio transmitter 10 according to the invention. Radio transmitter 10 may include a power amplifier 80. In an embodiment, power amplifier 80 may output a signal to another stage of radio transmitter 10. In another embodiment, power amplifier 80 may output a signal for the radio transmitter 10. In an embodiment, power amplifier 80 may be a radio frequency ("RF") power amplifier. In this embodiment, power amplifier 80 may output a RF signal between 3 kHz to 300 GHz, which may correspond to the frequency for radio waves.

Radio transmitter 10 may include one or more upconverters 50, 60. In an embodiment, radio transmitter 10 may include an upconverter 50 which may correspond to a narrowband upconverter having a high output power. In an embodiment, narrowband converter 50 may receive a traffic signal for the transmit band which may be converted to a higher frequency in the RF range. Narrowband converter 50 may include a digital-to-analog converter ("DAC") 52. Narrowband converter 50 may also include a filter 54 connected to DAC 52. As illustrated in FIG. 1, filter 54 may represent an ideal filter, but filter 54 is not restricted in its implementation. In an embodiment, filter 54 may be, but is not restricted to, a low-pass filter, a high-pass filter, a band-pass filter, an all-pass filter, a band-stop filter, a passive filter, an active filter, an analog filter, a digital filter, a discrete-time filter, a continuous-time filter, a linear filter, a non-linear filter, an infinite impulse response filter, or a finite impulse response filter. In an embodiment, filter 54 may be a low order filter, such as a first or second order filter. In other embodiments, filter 54 may be a high order filter.

Narrowband upconverter 50 may also include a modulator 56. Modulator 56 may be connected to filter 54. In an embodiment, modulator 56 may vary the filtered traffic signal through filter 54 with a high-frequency periodic carrier waveform supplied by signal generator 70. In an embodiment, the carrier waveform modulated with the filtered traffic signal may be a sinusoid wave carrier or square wave carrier. The wave carrier may allow for setting the frequency content of the filtered traffic signal close to the center frequency of the sinusoid or square wave carrier, which may be in the RF range. In an embodiment, the amplitude, phase, and frequency of the sinusoid or square wave carrier may be set. In an embodiment, the wave carrier may have an amplitude, A. Modulating the traffic signal with the wave carrier may result in a gain increase of the traffic signal equal to $A_{high}$ dB, which may correspond to the highest magnitude amplitude of the wave carrier. The resulting modulated signal from modulator 56 may be an RF signal.

Radio transmitter 10 may also include an upconverter 60 which may correspond to a wideband upconverter having a low output power. In an embodiment, wideband converter 60 may receive the digital predistortion signal corresponding to digital predistortion correction products and convert the signal to a higher frequency in the RF range. Wideband converter 60 may include a digital-to-analog converter ("DAC") 62. In an embodiment, wideband upconverter 60 may also include a filter 64 connected to DAC 62. This filter may have a higher bandwidth than filter 54. The filter 64 in wideband upconverter 60 may be, but is not restricted to, a low-pass filter, a high-pass filter, a band-pass filter, an all-pass filter, a band-stop filter, a passive filter, an active filter, an analog filter, a digital filter, a discrete-time filter, a continuous-time filter, a linear filter, a non-linear filter, an infinite impulse response filter, or a finite impulse response filter. In an embodiment, the filter 64 in wideband upconverter 60 may be a low order filter, such as a first or second order filter. In other embodiments, filter 64 may be a high order filter.

Wideband converter 60 may also include a modulator 66. Modulator 66 may be connected to filter 64. In an embodiment, modulator 66 may vary the digital predistortion signal with a similar high-frequency periodic carrier waveform supplied by signal generator 70 to modulator 56.

In an embodiment, the carrier waveform modulated with the digital predistortion signal is the same carrier waveform modulated with the traffic signal. In an example embodiment, this carrier waveform may be a sinusoid or square wave carrier. The wave carrier may also allow for setting the frequency content of the digital predistortion signal close to the center frequency of the wave carrier, which may be in the RF range. This may also allow for setting the frequency content of the modulated signal from modulator 66 at the same frequency as the modulated signal output from modulator 56. As the same wave carrier may be used for modulator 66 that is used for modulator 56, the wave carrier may have the same phase, frequency, and amplitude, A. Modulating the digital predistortion signal with the wave carrier may result in a gain increase of the digital predistortion signal equal to $A_{low}$ dB, which may correspond to the lowest magnitude amplitude of the wave carrier. The resulting modulated signal may be an RF signal.

Radio transmitter 10 may also include a summation block 75. In an embodiment, summation block 75 may be implemented as an analog operation. In an example embodiment, summation block 75 may be two current-mode modulators with outputs connected together. Summation block 75 may be connected at its inputs to narrowband upconverter 50 and wideband upconverter 60. The output of summation block 75 may be connected to power amplifier 80. In an embodiment, one input to summation block 75 may be connected to modulator 56. Another input to summation block 75 may be connected to modulator 66. Summation block 75 may receive the modulated signal from narrowband upconverter 50 at one input and receive the modulated signal from wideband upconverter 60 at a second input. In an embodiment, both these signals may be RF signals. Summation block 75 may add the modulated signal output from narrowband upconverter 50 with the modulated signal output from wideband upconverter 60 and output the result to power amplifier 80. In an embodiment, the signal output to power amplifier 80 may be a RF signal.

In an example embodiment, radio transmitter 10 may also include an observation downconverter 90 connected to an output of the power amplifier. In an embodiment, the observation downconverter 90 may be any type of linear receiver. Observation downconverter 90 may look at the output of the power amplifier 80 and may assist in the determination of the proper predistortion function to cancel the distortion of the power amplifier 80. Downconverter 90 may convert the RF signal to a lower frequency data signal which may be in accordance with the frequency range of the transmit data. This data signal may be transmitted to digital predistortion algorithm block 95.

Radio transmitter 10 may include digital predistortion ("DPD") algorithm block 95. DPD algorithm block 95 may be connected to observation downconverter 90. In an embodiment, DPD algorithm block 30 may be implemented using digital logic. DPD algorithm block 95 may receive a downconverted data signal corresponding to the output of power amplifier 80. DPD algorithm block 95 may analyze the distortion present due to noise in the output of the power amplifier 80 by comparing the downconverted data signal to the desired traffic signal. The DPD algorithm may, based on the comparison, determine digital predistortion coefficients to be set for digital predistortion to be applied to incoming transmit data. The coefficients may be set in a manner to minimize the difference between the desired traffic data and the output of the power amplifier 80. These digital predistortion coefficients may be set by the DPD algorithm at block 20, which may be connected to DPD algorithm block 95.

The digital predistortion coefficients may be set by the DPD algorithm in block 95 for block 20. Digital predistortion may be applied at block 20 to the transmit data. In an embodiment, digital predistortion block 20 may be implemented using digital logic. The application of the digital predistortion in block 20 results in a predistorted transmit signal that may yield lower distortion products at the power amplifier 80 output than if the original transmit data signal were applied. The predistorted transmit signal may be output from block 20 to summation block 25.

Radio transmitter 10 may also include a summation block 25. In an embodiment, summation block 25 may be implemented in logic as an adder, a subtractor, or an adder-subtractor. In an embodiment, summation block 25 may be implemented using digital logic. Summation block 25 may be connected at one input to block 20 and at another input to the incoming transmit data. In an embodiment, this transmit data may be received from another stage of radio transmitter 10.

The output of summation block 25 may be connected to amplifier 30. In an embodiment, summation block 25 may output the difference between the predistorted transmit signal and the transmit data. In an embodiment, this difference may represent the remaining digital predistortion correction products, known herein as the digital predistortion signal, which may be separate and independent of the transmit data. The digital predistortion signal may be output to amplifier 30.

Amplifier 30 may be situated in radio transmitter 10 between summation block 25 and wideband upconverter 60. Amplifier 30 may be connected at its input to summation block 25 and at its output to DAC 62 in the wideband upconverter 60. Amplifier 30 may receive the digital predistortion signal from summation block 25 and amplify the digital predistortion signal by a designated gain. In an embodiment, the gain set for amplifier 30 may be the difference in the gain between modulator 56 and modulator 66. The presence of amplifier 30 may allow for the gain of the traffic signal through the narrowband upconverter 50 and the gain of the digital predistortion signal through the wideband upconverter 60 to be the same. In this embodiment, the RF signals output by modulator 56 and by modulator 66 to summation block 75, as well as the resulting sum output to power amplifier 80, may have the same gain.

In an embodiment, where $A_{high}$ represents the highest magnitude amplitude of the wave carrier by generator 70 and $A_{low}$ represents the lowest magnitude amplitude of the wave carrier, the gain of amplifier 30 may be set to $A_{high}-A_{low}$.

Radio transmitter 10 may also include an equalization block 40 which may be connected to narrowband upconverter 50. In an embodiment, equalization block 40 may be part of a traffic upconverter or a predistortion upconverter path. In another embodiment, equalization block 40 may be part of both a traffic upconverter and a predistortion upconverter path. In an embodiment, equalization block 40 may be implemented using digital logic. In an embodiment, the output of equalization block 40 may be connected to DAC 52. Equalization block 40 may be implemented in conjunction with the narrowband upconverter 50 to correct for any phase error between the traffic signal transmitted through the path through the narrowband upconverter and the digital predistortion signal transmitted through the path through the wideband upconverter. The presence of equalization block 40 may allow for the correction of the phase difference, so that the modulated signal generated by modulator 56 and 66 may be in phase when added at summation block 75, resulting in a single in-phase RF signal output to the power amplifier 80. In addition to potential phase errors, equalization block 40 may also correct for any potential inequality in the group delays or amplitude response between the traffic signal and the digital predistortion signal. In an embodiment, equalization block 40 may be controlled by observation downconverter 90 which may set equalization block 40 based on the output of power amplifier 80.

In an alternate embodiment, equalization block 40 may be connected to wideband upconverter 60. In this embodiment, the output of equalization block 40 may be connected to DAC 62. In this embodiment, equalization block 40 may be implemented in conjunction with the wideband upconverter 60 to still correct for any phase error between the traffic signal transmitted through the path through the narrowband upconverter and the digital predistortion signal transmitted through the path through the wideband upconverter. The presence of equalization block 40 connected to wideband upconverter 60 may still provide for the correction of the phase difference, so that the modulated signal generated by modulator 56 and 66 may be in phase when added at summation block 75, resulting in a single in-phase RF signal output to the power amplifier 80.

In another alternate embodiment, equalization block 40 may be connected to both the narrowband upconverter 50 and the wideband upconverter 60 to correct for the phase error or inequality in the group delays or amplitude responses between the traffic signal transmitted through the narrowband upconverter path and the digital predistortion signal transmitted through the wideband upconverter path.

During operation, transmit data may be received, for example, from another stage of radio transmitter 10. The digital transmit data may be applied to digital predistortion block 20 and equalization block 40. Application of the transmit data to both blocks may reflect transmission over the two different paths. Digital predistortion block 20 may apply digital predistortion to the transmit data based on predistortion coefficients set by DPD algorithm 95. Digital predistortion block 20 may output the predistorted transmit signal to summation block 25. Summation block 25 may compare the predistorted transmit signal with the transmit data and generate a difference between the two signals. This difference may reflect the digital predistortion signal isolated from the transmit data. Summation block 25 may output the digital predistortion signal to amplifier 30.

Amplifier 30 may amplify the digital predistortion signal by a determined gain. In an embodiment, amplifier 30 may provide a digital scaling of the predistortion signal. In an embodiment, amplifier 30 may be implemented using digital logic. In an embodiment, the gain set for amplifier 30 may be equal to $A_{high}-A_{low}$, where A=the amplitude of the generated wave carrier. The amplified digital predistortion signal may be output to the low output power wideband upconverter 60. DAC 62 may convert the amplified digital predistortion signal to an analog signal, which may be transmitted to filter 64. Filter 64 may filter the amplified digital predistortion signal in accordance to the frequency parameters of the filter 64. Filter 64 may output the filtered digital predistortion signal to modulator 66. Modulator 66 may modulate the resulting analog signal with a wave carrier. In an embodiment, the modulator 66 may apply a determined gain. In an embodiment, this determined gain may be $A_{low}$. In this embodiment, the analog predistortion signal may have a gain equal to $A_{high}-A_{low}$, therefore the resulting modulated signal output by modulator 66 may correspond to an overall gain of $A_{high}$. A modulated signal corresponding to a RF signal, in the frequency range of 3 kHz to 300 GHz may be output to summation block 75.

In the other transmission path, transmit data may be applied to equalization block 40. Based on the resulting distortion at the output of the power amplifier 80, observation downconverter 90 may set equalization block 40 to correct for phase errors, amplitude response, and group delay between the transmit data and digital predistortion signal. Equalization block 40 may output a desired traffic signal to the high output power narrowband upconverter 50. DAC 52 may convert the traffic signal to an analog signal, which may be transmitted to filter 54. Filter 54 may filter the analog traffic signal in accordance to the frequency parameters of the filter 54. Filter 54 may output the filtered traffic signal to modulator 56. Because the traffic signal may comprise only ⅕th of the bandwidth of the predistortion signal, it may be filtered at ⅕th of the corner frequency.

Modulator 56 may modulate the resulting filtered traffic signal with a sinusoid or square wave carrier generated by signal generator 70. In an embodiment, the same sinusoid or square wave carrier varied with modulator 66, may be used with modulator 56. In an embodiment, the modulator 56 may apply a determined gain. In an embodiment, this determined gain may be $A_{high}$, therefore the resulting modulated signal output by modulator 56 may also correspond to an overall gain of $A_{high}$. Modulator 56 may output a modulated signal to summation block 75.

Summation block 75 may receive the modulated traffic signal and the modulated digital predistortion signal and add the two modulated signals, outputting the result to power amplifier 80. Distortion at the output of the power amplifier 80 may be monitored by observation downconverter 90, which may downconvert the output of the power amplifier to a lower frequency. DPD algorithm 95 may compare the output of the power amplifier 80, and thus the output of the observation downconverter 90, with the transmit data. DPD algorithm 95 may set the coefficients at digital predistortion block 20 to minimize the difference between the output of the power amplifier 80 and the transmit data. Equalization block 40 may also be set based on the output of the power amplifier 80.

Figure 2:
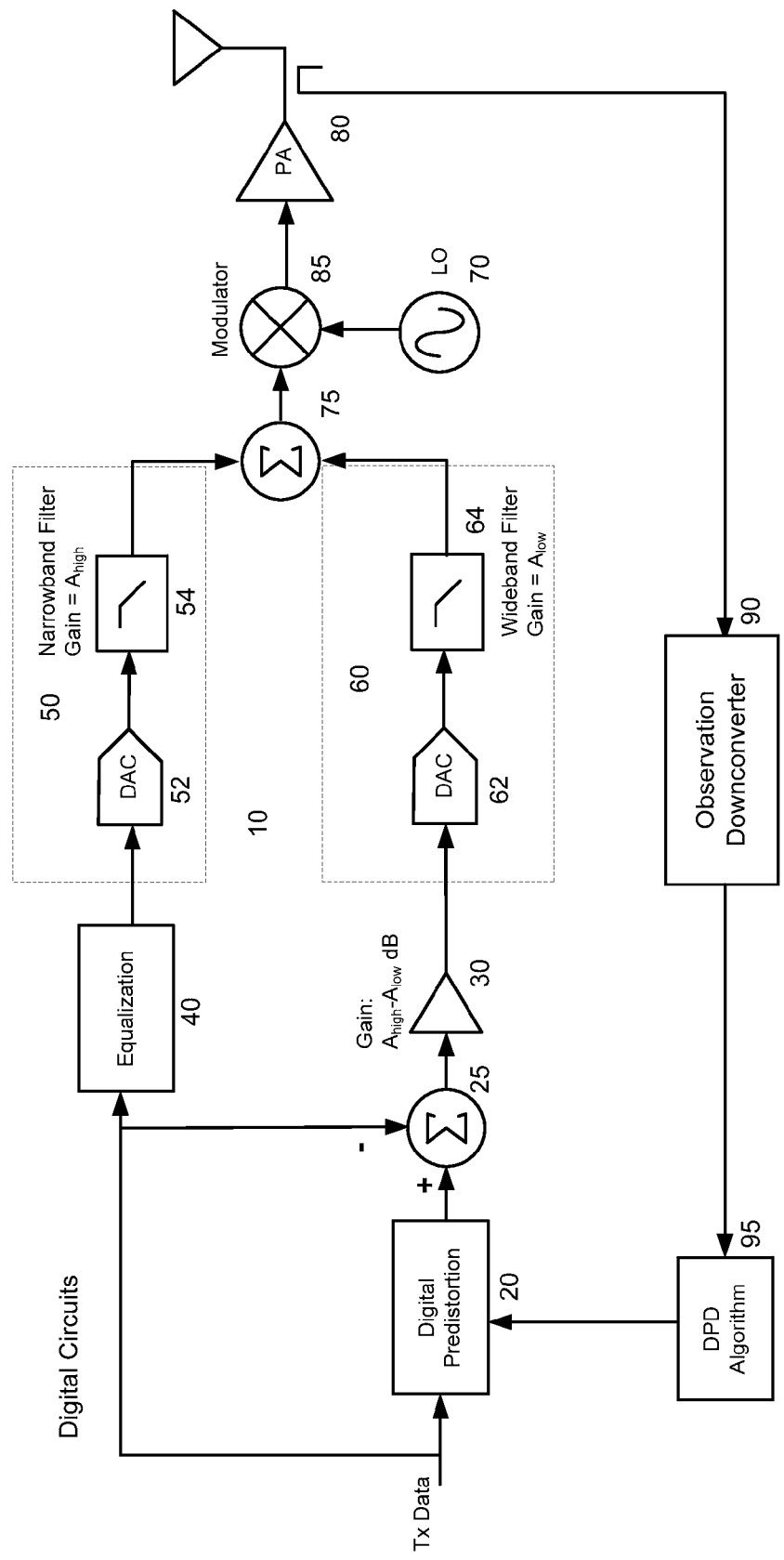
FIG. 2 is a diagram of an embodiment of a radio transmitter with digital predistortion having reduced noise within the synthesis bandwidth according to an embodiment of the present invention.

FIG. 2 illustrates an alternate embodiment of a stage of a radio transmitter 10 according to the invention. Radio transmitter 10 may include a power amplifier 80. In an embodiment, power amplifier 80 may output a signal to another stage of radio transmitter 10. In another embodiment, power amplifier 80 may output a signal for the radio transmitter 10. In an embodiment, power amplifier 80 may be a RF power amplifier. In this embodiment, power amplifier 80 may output a RF signal between 3 kHz to 300 GHz, which may correspond to the frequency for radio waves.

The radio transmitter 10 in FIG. 2 may include one or upconverters 50, 60. In an embodiment, radio transmitter 10 may include an upconverter 50 which may correspond to a narrowband upconverter having a high output power. In an embodiment, narrowband converter 50 may receive a traffic signal for the transmit band which may be converted to a higher frequency in the RF range. Narrowband converter 50 may include a DAC 52. Narrowband converter 50 may also include a filter 54 connected to DAC 52. As illustrated in FIG. 2, filter 54 may represent an ideal filter, but filter 54 is not restricted in its implementation. In an embodiment, filter 54 may be, but is not restricted to, a low-pass filter, a high-pass filter, a band-pass filter, an all-pass filter, a band-stop filter, a passive filter, an active filter, an analog filter, a digital filter, a discrete-time filter, a continuous-time filter, a linear filter, a non-linear filter, an infinite impulse response filter, or a finite impulse response filter. In an embodiment, filter 54 may be a low order filter, such as a first or second order filter. In other embodiments, filter 54 may be a high order filter. In an embodiment, filter 54 may apply a gain increase of the traffic signal equal to $A_{high}$ dB, which may correspond to the highest magnitude amplitude of the wave carrier generated by signal generator 70.

Radio transmitter 10 may also include an upconverter 60 which may correspond to a wideband upconverter having a low output power. In an embodiment, wideband converter 60 may receive the digital predistortion signal corresponding to digital predistortion correction products and convert the signal to a higher frequency in the RF range. Wideband converter 60 may include a DAC 62. In an embodiment, wideband upconverter 60 may also include a filter 64 connected to DAC 62. This filter may have a higher bandwidth than filter 54. The filter 64 in wideband upconverter 60 may be, but is not restricted to, a low-pass filter, a high-pass filter, a band-pass filter, an all-pass filter, a band-stop filter, a passive filter, an active filter, an analog filter, a digital filter, a discrete-time filter, a continuous-time filter, a linear filter, a non-linear filter, an infinite impulse response filter, or a finite impulse response filter. In an embodiment, the filter 64 in wideband upconverter 60 may be a low order filter, such as a first or second order filter. In other embodiments, filter 64 may be a high order filter. In an embodiment, filter 64 may apply a gain increase of the digital predistortion signal equal to $A_{low}$ dB, which may correspond to the lowest magnitude amplitude of the wave carrier generated by signal generator 70.

Radio transmitter 10 may also include a summation block 75. In an embodiment, summation block 75 may be implemented as an analog operation. In an example embodiment, summation block 75 may be two current-mode modulators with outputs connected together. Summation block 75 may be connected at its inputs to narrowband upconverter 50 and wideband upconverter 60. The output of summation block 75 may be connected to a modulator 85. In an embodiment, one input to summation block 75 may be connected to filter 54. Another input to summation block 75 may be connected to filter 65. Summation block 75 may receive the filtered traffic signal from narrowband upconverter 50 at one input and receive the filtered digital predistortion signal from wideband upconverter 60 at a second input. Summation block 75 may add the filtered traffic signal from narrowband upconverter 50 with the filtered digital predistortion signal from wideband upconverter 60 and output the result to modulator 85. In an embodiment, the signal output to power amplifier 80 may be a RF signal.

In the example embodiment in FIG. 2, radio transmitter 10 may include a single modulator 85. Modulator 85 may be connected to summation block 75. In an embodiment, modulator 85 may vary the sum of filtered traffic signal and the filtered digital predistortion signal with a periodic carrier waveform supplied by signal generator 70. Signal generator 70 may vary the frequency of the periodic carrier waveform. In an embodiment, the carrier waveform modulated with the summed filter signal may be a sinusoid wave carrier or square wave carrier. The wave carrier may allow for setting the frequency content of the summed filter signal output by summation block 75 close to the center frequency of the sinusoid or square wave carrier, which may be in the RF range. In an embodiment, the amplitude, phase, and frequency of the sinusoid or square wave carrier may be set. In an embodiment, the wave carrier may have an amplitude, A. The resulting modulated signal may be an RF signal, which may be output to the power amplifier 80.

In an example embodiment, radio transmitter 10 in FIG. 2 may also include an observation downconverter 90 connected to an output of the power amplifier 80. In an embodiment, the observation downconverter 90 may be any type of linear receiver. Observation downconverter 90 may look at the output of the power amplifier 80 and may assist in the determination of the proper predistortion function to cancel the distortion of the power amplifier 80. Downconverter 90 may convert the RF signal to a lower frequency data signal which may be in accordance with the frequency range of the transmit data. This data signal may be transmitted to digital predistortion algorithm block 95.

The radio transmitter 10 in the example embodiment of FIG. 2 may include DPD algorithm block 95. DPD algorithm block 95 may be connected to observation downconverter 90. In an embodiment, DPD algorithm block 30 may be implemented using digital logic. DPD algorithm block 95 may receive a downconverted data signal corresponding to the output of power amplifier 80. DPD algorithm block 95 may analyze the distortion present due to noise in the output of the power amplifier 80 by comparing the downconverted data signal to the desired traffic signal. The DPD algorithm may, based on the comparison, determine digital predistortion coefficients to be set for digital predistortion to be applied to incoming transmit data. The coefficients may be set in a manner to minimize the difference between the desired traffic data and the output of the power amplifier 80. These digital predistortion coefficients may be set by the DPD algorithm at block 20, which may be connected to DPD algorithm block 95.

The digital predistortion coefficients may be set by the DPD algorithm in block 95 for block 20. Digital predistortion may be applied at block 20 to the transmit data. In an embodiment, digital predistortion block 20 may be implemented using digital logic. The application of the digital predistortion in block 20 results in a predistorted transmit signal that may yield lower distortion products at the power amplifier 80 output than if the original transmit data signal were applied. The predistorted transmit signal may be output from block 20 to summation block 25.

Radio transmitter 10 in the example embodiment of FIG. 2 may also include a summation block 25. In an embodiment, summation block 25 may be implemented in logic as an adder, a subtractor, or an adder-subtractor. In an embodiment, summation block 25 may be implemented using digital logic. Summation block 25 may be connected at one input to block 20 and at another input to the incoming transmit data. In an embodiment, this transmit data may be received from another stage of radio transmitter 10. The output of summation block 25 may be connected to amplifier 30. In an embodiment, summation block 25 may output the difference between the predistorted transmit signal and the transmit data. In an embodiment, this difference may represent the remaining digital predistortion correction products, known herein as the digital predistortion signal, which may be separate and independent of the transmit data. The digital predistortion signal may be output to amplifier 30.

Amplifier 30 may be situated in radio transmitter 10 between summation block 25 and wideband upconverter 60. Amplifier 30 may be connected at its input to summation block 25 and at its output to DAC 62 in the wideband upconverter 60. Amplifier 30 may receive the digital predistortion signal from summation block 25 and amplify the digital predistortion signal by a designated gain. In an embodiment, the gain set for amplifier 30 may be the difference in the gain between filter 54 and filter 64. The presence of amplifier 30 may allow for the gain of the traffic signal through the narrowband upconverter 50 and the gain of the digital predistortion signal through the wideband upconverter 60 to be the same when they arrive at summation block 75.

In an embodiment, where $A_{high}$ represents the highest magnitude amplitude of the wave carrier by generator 70 and $A_{low}$ represents the lowest magnitude amplitude of the wave carrier, the gain of amplifier 30 may be set to $A_{high}-A_{low}$. This allows for the summed filter signal output by summation block 75 to have a gain equal to $A_{high}$.

The radio transmitter 10 in the example embodiment of FIG. 2 may also include an equalization block 40 which may be connected to narrowband upconverter 50. In an embodiment, equalization block 40 may be part of a traffic upconverter or a predistortion upconverter path. In another embodiment, equalization block 40 may be part of both a traffic upconverter and a predistortion upconverter path. In an embodiment, equalization block 40 may be implemented using digital logic. In an embodiment, the output of equalization block 40 may be connected to DAC 52. Equalization block 40 may be implemented in conjunction with the narrowband upconverter 50 to correct for any phase error between the traffic signal transmitted through the path through the narrowband upconverter and the digital predistortion signal transmitted through the path through the wideband upconverter. The presence of equalization block 40 may allow for the correction of the phase difference, so that the filtered signals output by filters 54 and 64 may be in phase when added at summation block 75, resulting in a single in-phase signal output to the modulator 85. In addition to potential phase errors, equalization block 40 may also correct for any potential inequality in the group delays or amplitude response between the traffic signal and the digital predistortion signal. In an embodiment, equalization block 40 may be controlled by observation downconverter 90 which may set equalization block 40 based on the output of power amplifier 80.

In an alternate embodiment, equalization block 40 may be connected to wideband upconverter 60. In this embodiment, the output of equalization block 40 may be connected to DAC 62. In this embodiment, equalization block 40 may be implemented in conjunction with the wideband upconverter 60 to still correct for any phase error between the traffic signal transmitted through the path through the narrowband upconverter and the digital predistortion signal transmitted through the path through the wideband upconverter. The presence of equalization block 40 connected to wideband upconverter 60 may still provide for the correction of the phase difference, so that the filtered signals output by filters 54 and 64 may be in phase when added at summation block 75, resulting in a single in-phase signal output to the modulator 85.

In another alternate embodiment, equalization block 40 may be connected to both the narrowband upconverter 50 and the wideband upconverter 60 to correct for the phase error or inequality in the group delays or amplitude responses between the traffic signal transmitted through the narrowband upconverter path and the digital predistortion signal transmitted through the wideband upconverter path.

During operation, transmit data may be received, for example, from another stage of radio transmitter 10. The digital transmit data may be applied to digital predistortion block 20 and equalization block 40. Application of the transmit data to both blocks may reflect transmission over the two different paths. Digital predistortion block 20 may apply digital predistortion to the transmit data based on predistortion coefficients set by DPD algorithm 95. Digital predistortion block 20 may output the predistorted transmit signal to summation block 25. Summation block 25 may compare the predistorted transmit signal with the transmit data and generate a difference between the two signals. This difference may reflect the digital predistortion signal isolated from the transmit data. Summation block 25 may output the digital predistortion signal to amplifier 30.

Amplifier 30 may amplify the digital predistortion signal by a determined gain. In an embodiment, amplifier 30 may provide a digital scaling of the predistortion signal. In an embodiment, amplifier 30 may be implemented using digital logic. In an embodiment, the gain set for amplifier 30 may be equal to $A_{high} - A_{low}$, where A=the amplitude of the generated wave carrier. The amplified digital predistortion signal may be output to the low output power wideband upconverter 60. DAC 62 may convert the amplified digital predistortion signal to an analog signal, which may be transmitted to filter 64. Filter 64 may filter the amplified digital predistortion signal in accordance to the frequency parameters of the filter 64. In an embodiment, filter 64 may apply a determined gain. Filter 64 may output the filtered digital predistortion signal to summation block 75.

In the other transmission path, transmit data may be applied to equalization block 40. Based on the resulting distortion at the output of the power amplifier 80, observation downconverter 90 may set equalization block 40 to correct for phase errors, amplitude response, and group delay between the transmit data and digital predistortion signal. Equalization block 40 may output a desired traffic signal to the high output power narrowband upconverter 50. DAC 52 may convert the traffic signal to an analog signal, which may be transmitted to filter 54. Filter 54 may filter the analog traffic signal in accordance to the frequency parameters of the filter 54. In an embodiment, filter 54 may apply a determined gain. Filter 54 may output the filtered traffic signal to summation block 75.

Summation block 75 may receive the filtered traffic signal and the filtered digital predistortion signal and add the two filtered signals, outputting the result to modulator 85. Modulator 85 may modulate the summed filter signals with a sinusoid or square wave carrier generated by signal generator 70. In an embodiment, the resulting modulated signal output by modulator 85 may correspond to an overall gain of $A_{high}$. A modulated signal corresponding to a RF signal, in the frequency range of 3 kHz to 300 GHz may be output to power amplifier 80.

Distortion at the output of the power amplifier 80 may be monitored by observation downconverter 90, which may downconvert the output of the power amplifier to a lower frequency. DPD algorithm 95 may compare the output of the power amplifier 80, and thus the output of the observation downconverter 90, with the transmit data. DPD algorithm 95 may set the coefficients at digital predistortion block 20 to minimize the difference between the output of the power amplifier 80 and the transmit data. Equalization block 40 may also be set based on the output of the power amplifier 80.

Several embodiments of the invention are specifically illustrated and/or described herein. However, it will be appreciated that modifications and variations of the invention are covered by the above teachings and within the purview of the appended claims without departing from the spirit and intended scope of the invention.

What is claimed is:

1. A radio transmitter having reduced noise comprising:
    a power amplifier;
    a digital predistortion arrangement to apply digital predistortion to a transmit signal having a narrowband component, the digital predistortion arrangement generating a predistortion signal having the narrowband component and a wideband component;
    a first upconverter to upconvert the narrowband component; and
    a second upconverter to upconvert the wideband component;
    wherein outputs of the first and second upconverters are summed, the sum being transmitted to the power amplifier.

2. The radio transmitter according to claim 1, wherein the digital predistortion is set by coefficients determined by a digital predistortion algorithm.

3. The radio transmitter according to claim 2, wherein the coefficients are determined by the digital predistortion algorithm to minimize a difference between the transmit signal and an output of the power amplifier.

4. The radio transmitter according to claim 1, wherein the wideband component of the predistortion signal includes digital predistortion correction products.

5. The radio transmitter according to claim 1, further comprising:

an equalization arrangement to correct at least one of a phase difference, a group delay, and an amplitude response between the narrowband component and the wideband component.

6. The radio transmitter according to claim 5, wherein the equalization arrangement is set by a downconverter monitoring an output of the power amplifier.

7. The radio transmitter according to claim 1, wherein the first upconverter includes a digital-to-analog converter.

8. The radio transmitter according to claim 1, wherein the first upconverter includes a filter.

9. The radio transmitter according to claim 1, wherein the first upconverter includes a modulator to modulate the narrowband component with a varying signal.

10. The radio transmitter according to claim 9, wherein the varying signal is a sinusoid or square wave carrier.

11. The radio transmitter according to claim 1, further comprising:
an amplifier to correct a gain difference between the first and the second upconverter.

12. The radio transmitter according to claim 1, further comprising:
a downconverter to monitor an output of the power amplifier.

13. The radio transmitter according to claim 1, wherein the second upconverter includes a digital-to-analog converter.

14. The radio transmitter according to claim 1, wherein the second upconverter includes a filter.

15. The radio transmitter according to claim 1, wherein the second upconverter includes a modulator to modulate the wideband component with a varying signal.

16. The radio transmitter according to claim 15, wherein the varying signal is a sinusoid or square wave carrier.

17. The radio transmitter according to claim 1, wherein the sum is modulated by a modulator before being transmitted to the power amplifier.

18. A method for reducing noise due to distortion in a radio transmitter, the method comprising:
generating a predistortion signal from an application of digital predistortion coefficients to a transmit signal having a narrowband component;
separating the predistortion signal into the narrowband component and a wideband component;
correcting for at least one of a phase difference, a group delay, and an amplitude response between the narrowband component and the wideband component;
upconverting the narrowband component to a higher frequency through modulation with a varying signal by a first upconverter;
upconverting the wideband component to the higher frequency through modulation with the varying signal by a second upconverter;
summing an upconverted narrowband component and an upconverted wideband component; and
outputting the sum to a power amplifier.

19. The method according to claim 18, wherein the digital predistortion coefficients are determined by a digital predistortion algorithm.

20. The method according to claim 19, wherein the digital predistortion coefficients are determined by the digital predistortion algorithm to minimize a difference between the transmit signal and an output of the power amplifier.

21. The method according to claim 18, wherein the wideband component of the predistortion signal includes digital predistortion correction products.

22. The method according to claim 18, wherein the first upconverter includes a filter.

23. The method according to claim 18, further comprising:
amplifying the narrowband component of the predistortion signal to correct a gain difference between the first and the second upconverter.

24. The method according to claim 18, further comprising:
monitoring an output of the power amplifier with a downconverter.

25. The method according to claim 18, wherein the varying signal is a sinusoid or square wave carrier.

26. The method according to claim 18, wherein the second upconverter includes a filter.

27. A method for reducing noise due to distortion in a radio transmitter, the method comprising:
generating a predistortion signal from an application of digital predistortion coefficients to a transmit signal having a narrowband component;
separating the predistortion signal into the narrowband component and a wideband component;
correcting for at least one of a phase difference, group delay, and amplitude response between the narrowband component and the wideband component;
filtering the narrowband component with a first filter in a first upconverter;
filtering the wideband component with a second filter in a second upconverter;
summing the filtered narrowband component and the filtered wideband component;
modulating the sum with a varying signal by a modulator; and
outputting the modulated sum to a power amplifier.

* * * * *